US007538634B2

(12) United States Patent
Mallegol

(10) Patent No.: US 7,538,634 B2

(45) Date of Patent: May 26, 2009

(54) FREQUENCY DIPLEXER WITH AN INPUT PORT AND A FIRST AND A SECOND OUTPUT PORTS

(75) Inventor: Stephane Mallegol, Reenes Cedex 7 (FR)

(73) Assignee: Mitsubishi Electric Corporation, Tokyo (JP)

( * ) Notice: Subject to any disclaimer, the term of this patent is extended or adjusted under 35 U.S.C. 154(b) by 224 days.

(21) Appl. No.: 11/580,182

(22) Filed: Oct. 13, 2006

(65) Prior Publication Data

US 2007/0096846 A1 May 3, 2007

(30) Foreign Application Priority Data

Oct. 28, 2005 (EP) ................................ 05292300

(51) Int. Cl.
*H01P 5/12* (2006.01)
*H03H 7/46* (2006.01)

(52) U.S. Cl. ...................... 333/110; 333/132; 333/126; 333/129

(58) Field of Classification Search ................ 333/109, 333/110, 126, 129, 132
See application file for complete search history.

(56) References Cited

U.S. PATENT DOCUMENTS

| | | | | |
|---|---|---|---|---|
| 4,240,155 | A * | 12/1980 | Vaughan | 370/297 |
| 5,058,198 | A | 10/1991 | Rocci et al. | |
| 5,155,724 | A | 10/1992 | Edwards | |
| 6,020,795 | A | 2/2000 | Kim | |
| 6,278,498 | B1 * | 8/2001 | Neff | 348/723 |

* cited by examiner

*Primary Examiner*—Benny Lee
*Assistant Examiner*—Kimberly E Glenn
(74) *Attorney, Agent, or Firm*—Oblon, Spivak, McClelland, Maier & Neustadt, P.C.

(57) ABSTRACT

The present invention concerns a frequency diplexer with an input port and a first and a second output ports, comprising
- two directional couplers (14 and 15),
- an unique filter (16) that entails either a first or a second frequency response, and,
- a first and a second T splitters (19, 40).

3 Claims, 6 Drawing Sheets

FREQUENCY DIPLEXER WITH AN INPUT PORT AND A FIRST AND A SECOND OUTPUT PORTS

The present invention concerns a frequency diplexer having on a first output port a given frequency response over a first frequency range and on a second output port another frequency response over a second frequency range complementary of the first frequency range. For example, a frequency diplexer according to the invention acts as a band-pass/band-reject filter having a first output port for the band-pass filtered signals and a second output port for the band-rejected signals. Moreover, such frequency diplexer is made up in the microwave technology, for instance in the microstrip technology.

Although the following description uses the terms “input” and “output” that could make it to be the description of devices in which the signals propagate only from an input port to an output port, it must be understood that it not the case, said devices of the present invention are intended to work either in a direction (the signals propagate from an input port to an output port) or in the other direction (the signals propagate from an output port to an input port).

Figure 1:
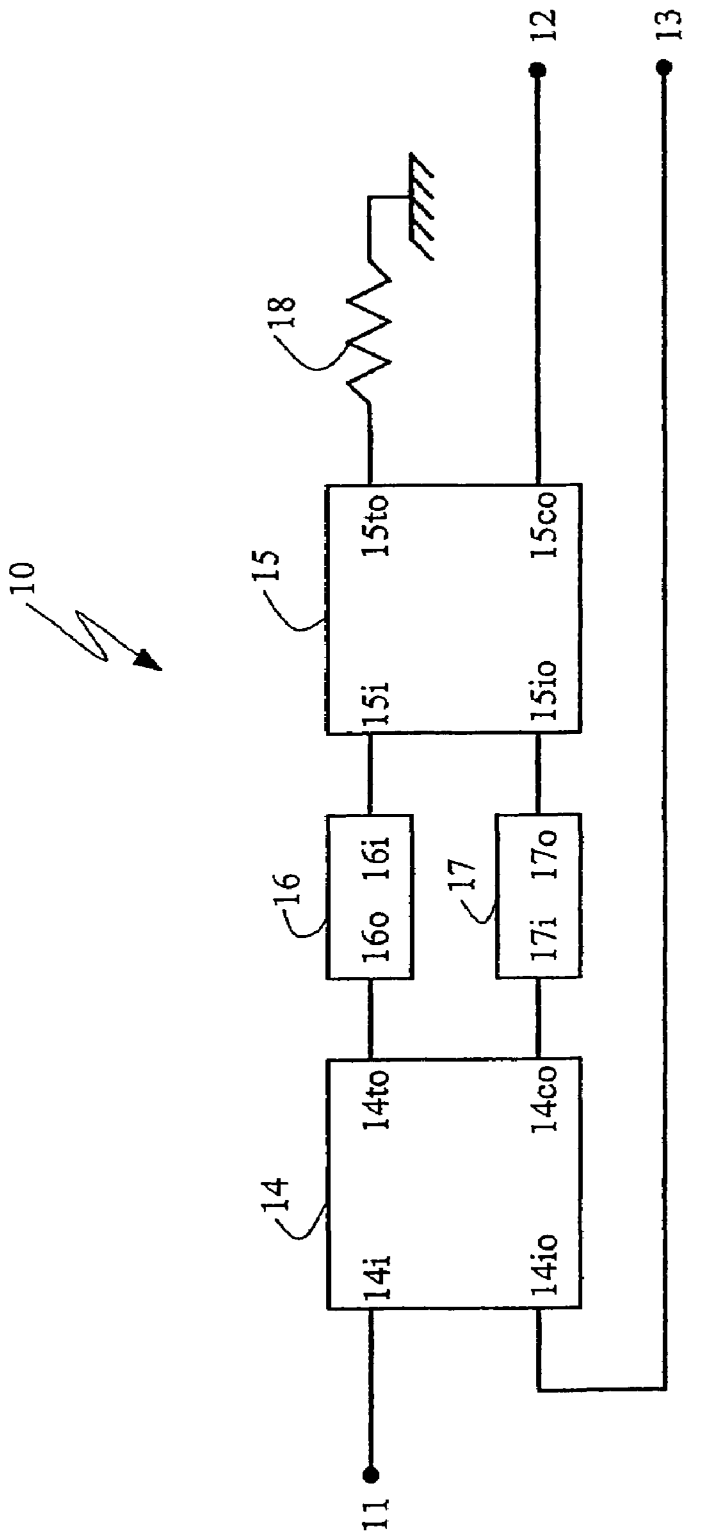
Fig. 1 BACKGROUND ART

FIG. 1 shows a frequency diplexer 10 as known according to the prior art. Such a frequency diplexer has one input port 11 and two output ports 12 and 13. It comprises two directional couplers 14 and 15, the left one 14 on FIG. 2 being said an upstream directional coupler and the right one 15 being said a downstream directional coupler. Each directional coupler 14; 15 has one input port 14*i*; 15*i* and three output ports generally said: a coupled port 14*co*; 15*co*, an isolated port 14*io*; 15*io* and a through port 14*to*: 15*to*. The input port 14*i* of the upstream directional coupler 14 acts as the input port 11 of the frequency diplexer 10. The isolated output port 14*io* of the uplink directional coupler 14 acts as the second output port 13 of the frequency diplexer 10. The through output port 14 to of the uplink directional coupler 14 is connected to the output port 16*o* of a first filter 16 the input port 16*i* of which is connected to the input port 15*i* of the downstream directional coupler 15. The coupled output port 14*co* of the upstream directional coupler 14 is connected to the input port 17*i* of a second filter 17 the output port 17*o* of which is connected to the isolated output port 15*io* of the downstream directional coupler 15. The through output port 15*to* of the downstream directional coupler 15 is supplied by a short-circuited adapting impedance 18. The coupled output port 15*co* of the upstream directional coupler 15 acts as the first output port 12 of the frequency diplexer 10.

The two couplers 14 and 15 of a diplexer 10 are directional couplers, for example Lange couplers. Each signal over either the through output port 14*to*; 15*to* or the coupled output port 14*co*; 15*co* of each directional coupler is attenuated relative to the input port by a 3 dB factor and the phase difference between the signals over these two output ports is $\pi/2$.

Note though the terminology used is the one of Lange couplers, it must be understood that the couplers may be of another type.

The two filters 16 and 17 of a frequency diplexer 10 are identical. The frequency diplexer 10 depicted in FIG. 1 entails a given frequency response over a first frequency range on the first output port, for example the port 12, and another frequency response over a second frequency range complementary of the first frequency range on the second output port, for example the port 13. The filters 16 and 17 may be band-pass filters making the frequency diplexer 10 to act as a band-pass/band reject filter (one output port 12 for the band-pass filtered signals and the other output port 13 for the band reject filtered signals). They may be band-reject still making the frequency diplexer 10 to act as a band-pass/band reject filter. They may be high-pass or low-pass filters making the frequency diplexer 10 to act as a low-pass/high-reject filter.

In order to efficiently work, such a diplexer needs to have its two filters to be accurately matched, this matching turning out to be a tricky task that generally finds solutions in an increase of the complexity of the diplexer.

It is an aim of the present invention to on the contrary decrease the complexity of a frequency diplexer compared with a frequency diplexer of the prior art of the type depicted in FIG. 1.

This aim is achieved by providing a frequency diplexer with an input port and a first and a second output ports, said frequency diplexer entailing on the first output port a first frequency response over a first frequency range and on a second output port another frequency response over a second frequency range complementary of the first frequency range. According to the invention, said frequency diplexer comprises two directional couplers, each of which has one input port, a coupled output port, an isolated output port and a through output port, the input port of the upstream directional coupler acting as the input port of the diplexer, the isolated output port of the upstream directional coupler acting as the second output port of the diplexer, the through output port of the downstream directional coupler being supplied by a short-circuited adapting impedance and the coupled output port acting as the first output port of the diplexer, and an unique filter that entails either the first or the second frequency response, and a first and a second T splitters, the through output port and the coupled output port of the upstream directional coupler being respectively connected to the two ports of the first T splitter the third port of which is connected to the output port of the filter the input port of which is connected to a first port of the second T splitter, the two ports of the second T splitter being respectively connected the input port and to the isolated output port of the downstream coupler.

The present invention also relates to a frequency multiplexing-demultiplexing device having an input port and N output ports, said device comprises a series of N−1 diplexers, each diplexers acting as a band pass/band reject filter having a band-pass output port and a band reject output port, the band-pass output port of each diplexer being connected to an output port of said device and the band reject output port of each diplexer being connected to the input port of the following diplexer in the series of diplexers except for the last diplexer of the series, the input port of the first diplexer of the series being connected to the input port of the device, the band that a diplexer lets to pass over its band-pass output port being included inside the band that the previous diplexer lets to pass over its band-rejected output port, said diplexers being frequency diplexers according to the present invention as aforedescribed .

The present invention also relates to a frequency multiplexing-demultiplexing device having an input port and N output ports, said device comprising a first diplexer the input port of which is connected to the input port of the device and the two output ports of which are respectively connected to the input ports of two second diplexers, the output ports of the two second diplexers are respectively connected to the four output ports of the device, the first diplexer acting as a band-pass/band-reject filter and the two second diplexers acting as low-pass/high-pass filters, said diplexers being frequency diplexers according to the present invention as aforedescribed.

Figure 2:
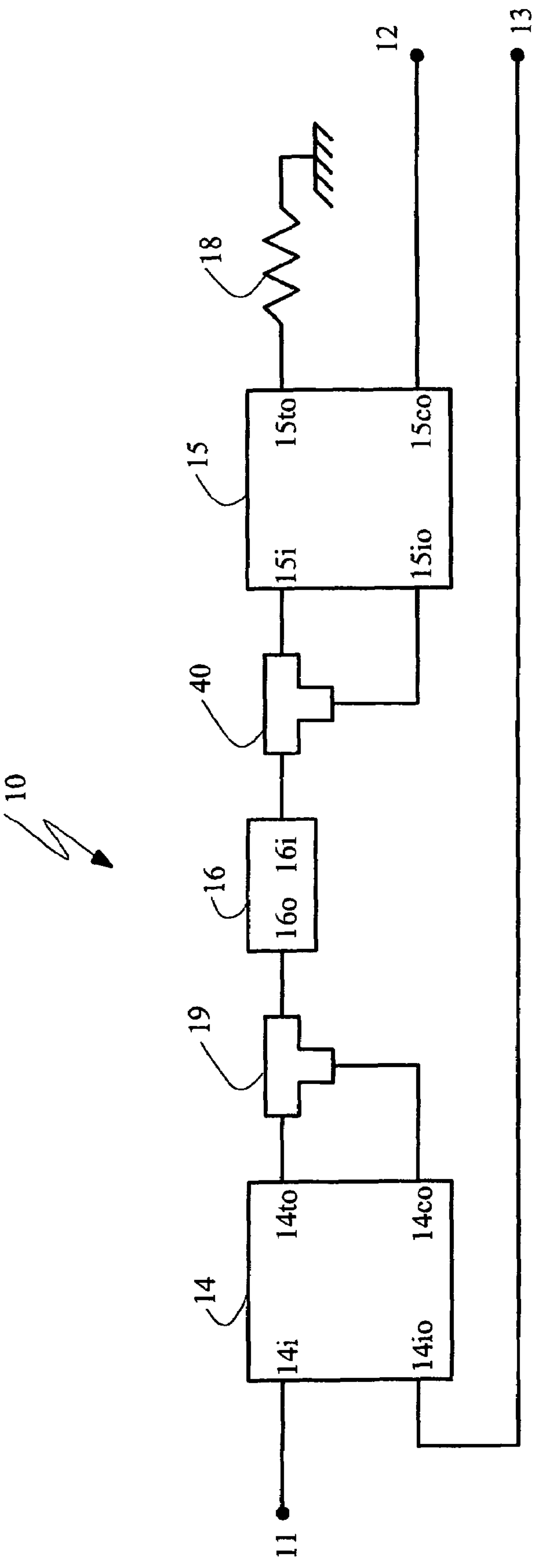
Figure 3:
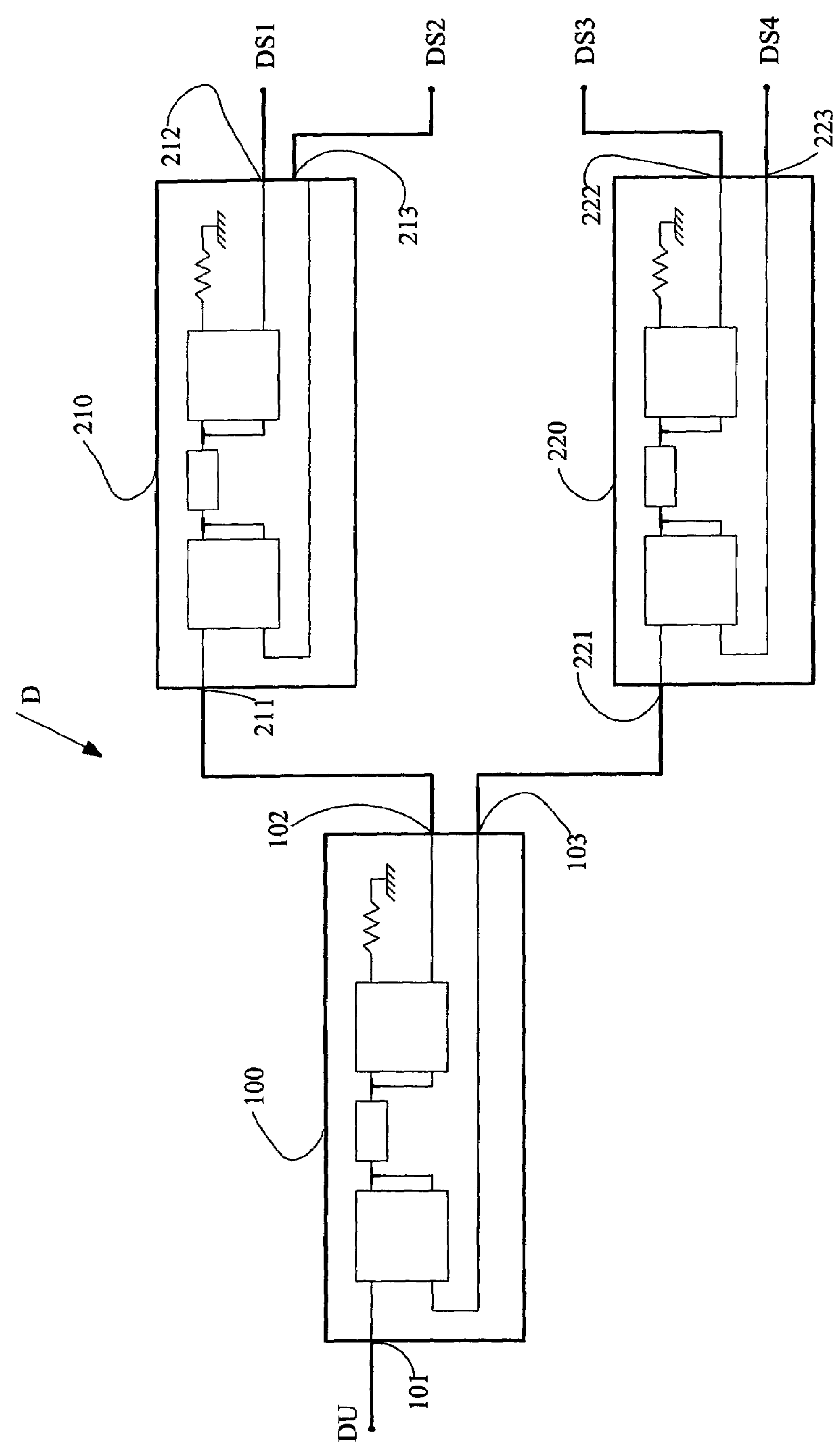
Figure 4:
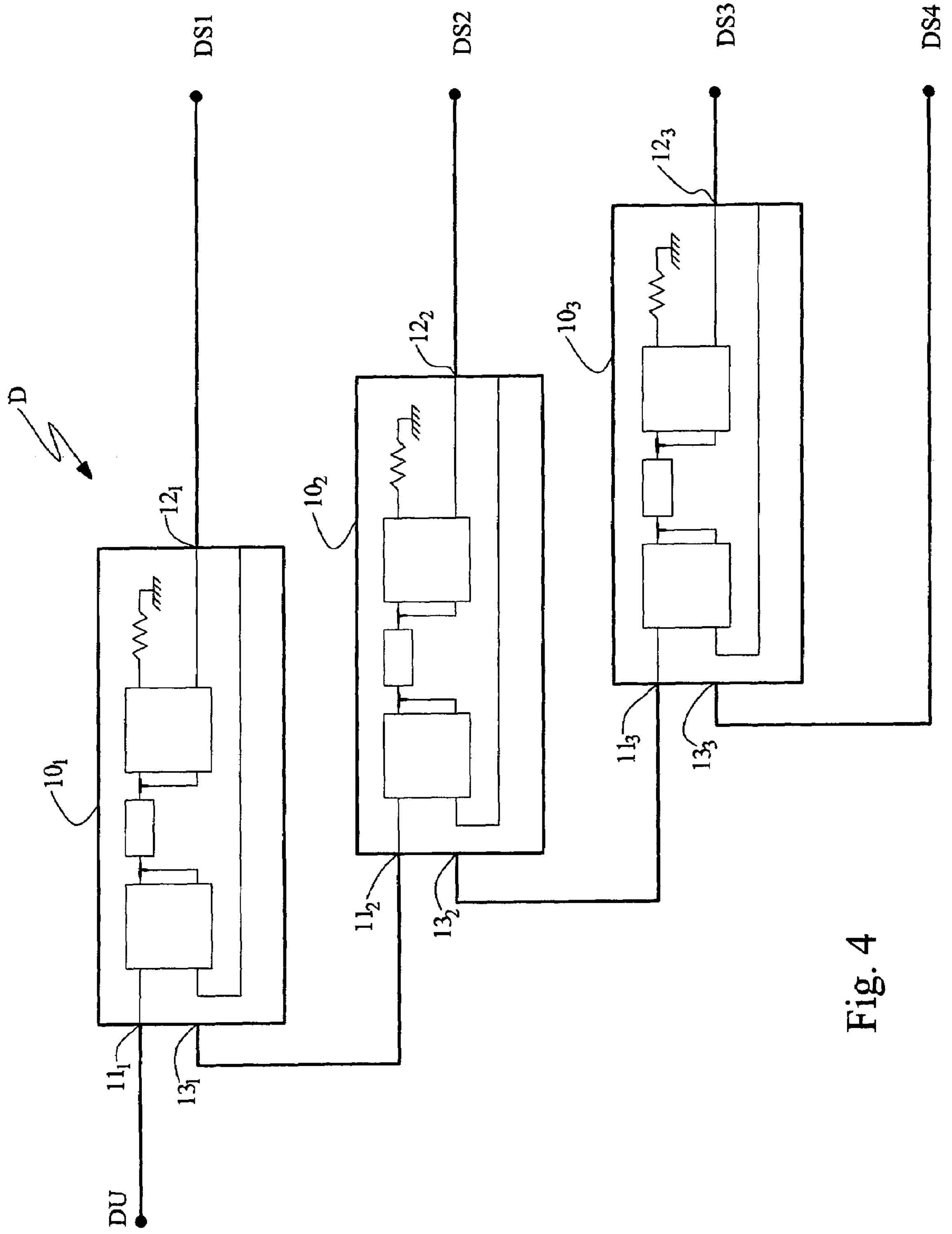
Figure 5A:
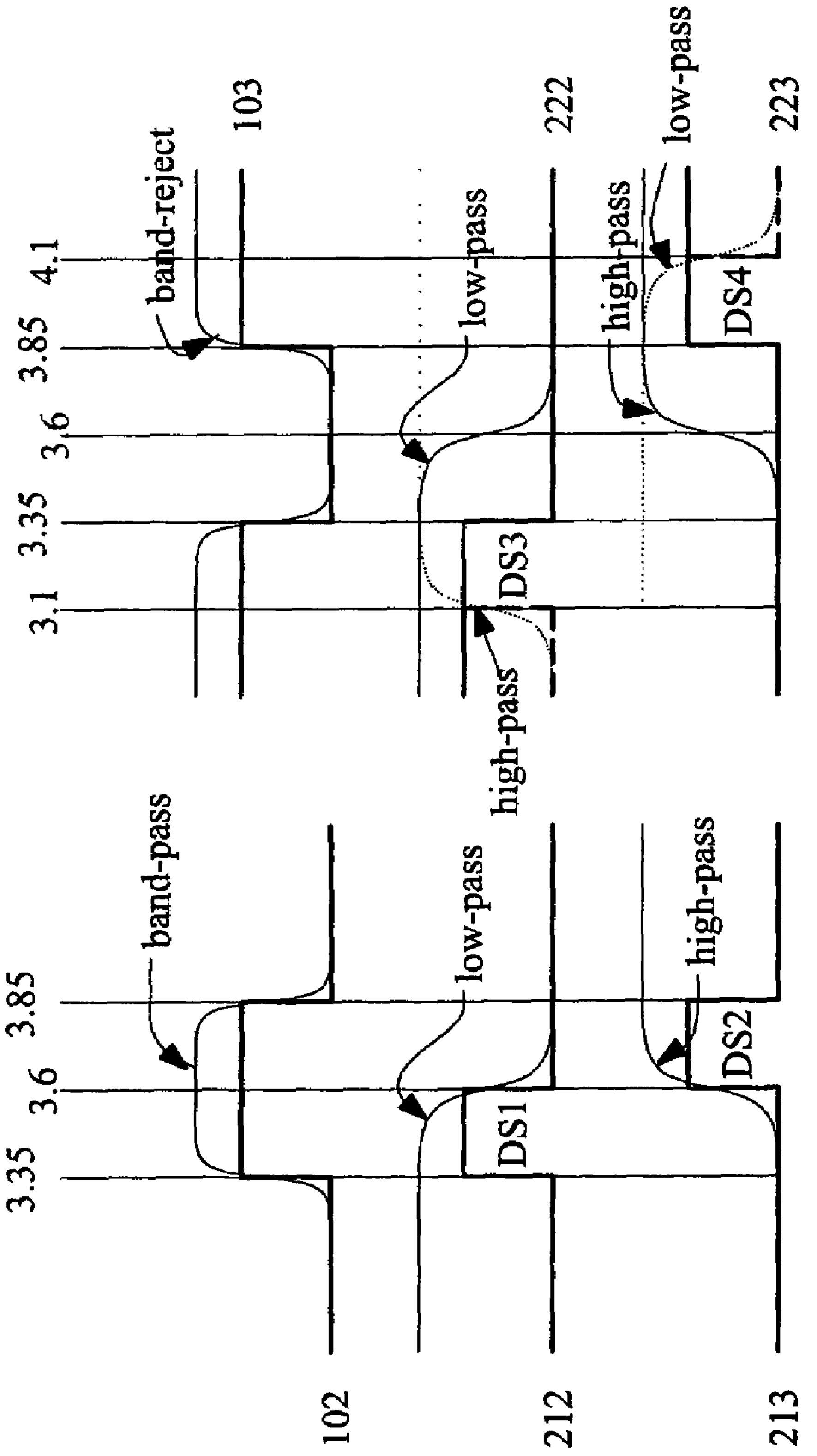
Figure 5B:
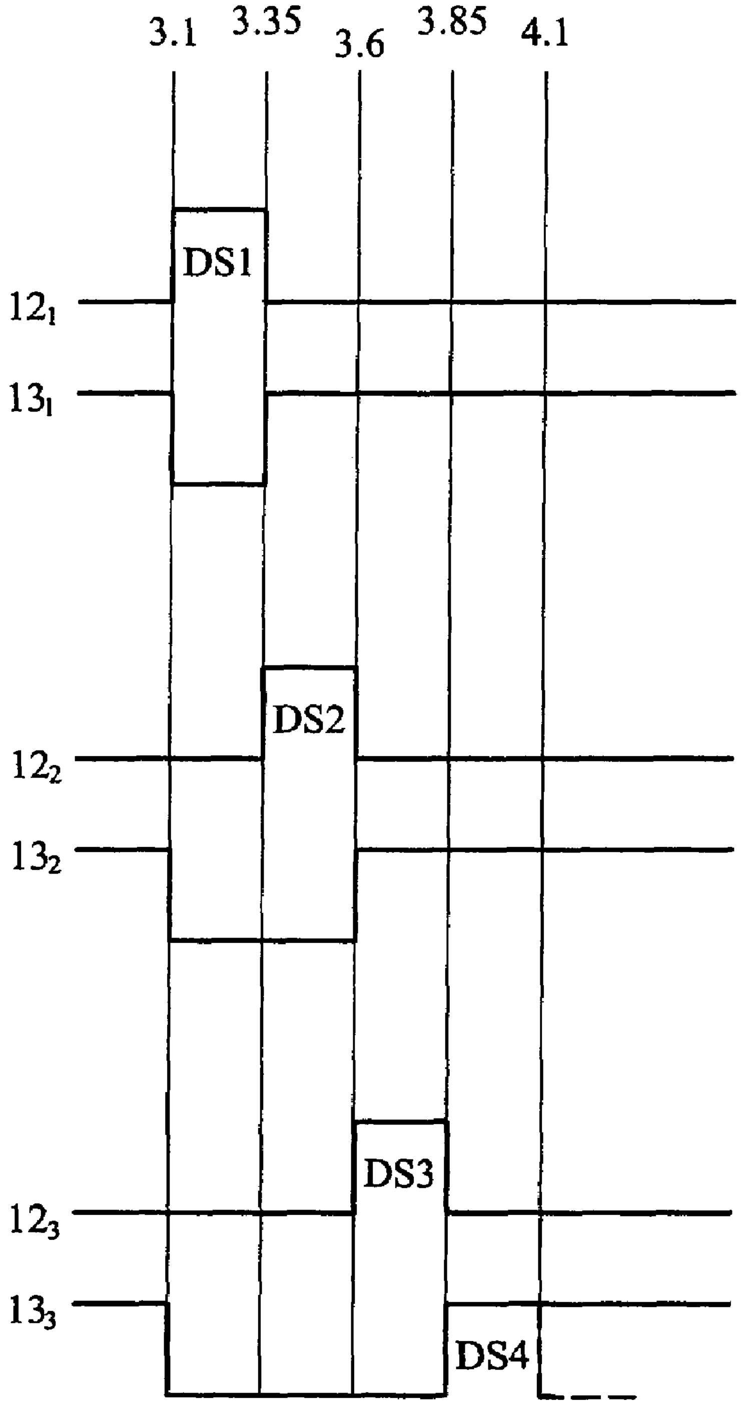

The characteristics of the invention mentioned above, as well as others, will emerge more clearly from a reading of the following description given in relation to the accompanying figures, amongst which:

FIG. 1 shows the structure of a diplexer according to the prior art,

FIG. 2 shows the structure of a diplexer according to the present invention, FIG. 3 shows a frequency multiplexing-demultiplexing device according to a first embodiment of the invention, FIG. 4 shows a frequency multiplexing-demultiplexing device according to a second embodiment of the invention, and FIGS. 5*a* and 5*b* are views for illustrating the principles of the frequency multiplexing-demultiplexing devices of the embodiments of the present invention respectively shown in FIGS. 3 and 4.

A frequency diplexer according to the invention is now described in relation with FIG. 2. As a frequency diplexer of the prior art, it has one input port 11 and two output ports 12 and 13. It comprises two directional couplers 14 and 15, each of which has one input port 14*i*; 15*i* and three output ports: a coupled port 14*co*; 15*co*, an isolated port 14*io*; 15*io* and a through port 14*to* 15*to*. The input port 14*i* of the upstream directional coupler 14 acts as the input port 11 of the diplexer 10 and the isolated output port 14*io* acts as the second output port 13 of the diplexer 10. The through output port 15*to* of the downstream directional coupler 15 is supplied by a short-circuited adapting impedance 18 and the coupled output port 15*co* acts as the first output port 12 of the diplexer 10.

According to the invention, the through output port 14*to* and the coupled output port 14*co* of the upstream directional coupler 14 are respectively connected to two ports of a first T splitter 19, the third port of said T splitter 19 being connected to the output port 16*o* of a unique filter 16. The input port 16*i* of the filter 16 is connected to a first port of a second T splitter 40, the two ports of the T splitter 40 being respectively connected the input port 15*i* and to the isolated output port 15*io* of the downstream coupler 15.

It is understood that the use of a unique filter 16 and of two T splitters 19 and 40 instead of two filters that have to be matched like in the prior art decreases the complexity of a frequency diplexer compared with a prior art diplexer.

The diplexer 10 can be made up according to the microstrip technology. Thus, the lines between each element of the diplexer can be microstrip lines. Each element can be thus microstrip elements, for example, Lange directional couplers, microstrip splitters 19 and a coupled lines filter.

A frequency diplexer according to the invention such as the frequency diplexer 10 depicted in FIG. 2 can be used in a frequency multiplexing-demultiplexing device having an input port and at least two output ports. Such a device can act as a demultiplexer dispatching electromagnetic energy from the input port toward a plurality of output ports depending on the frequency of the input signal and, conversely, can act as a multiplexer merging the electromagnetic energy from said plurality of output ports towards the input port.

FIG. 3 shows a frequency multiplexing-demultiplexing device D according to a first embodiment of the invention. It comprises a first frequency diplexer 100 the input port 101 of which is connected to the input port DU of the device D and the two output ports 102 and 103 of which are respectively connected to the input ports 211 and 221 of two second frequency diplexers 210 and 220. Since the multiplexing-demultiplexing device depicted in FIG. 3 is a four output ports device, the output ports 212, 213; 222, 223 of the two second diplexers 210 and 220 are respectively connected to the four output ports DS1 to DS4 of the device D. The first diplexer 100 generally acts as a band-pass/band-reject filter with an output port, for example port 102, for the band-pass filtered signals and another output port, for example port 103, for the band-rejected signals. As for the two second diplexers 210 and 220, they act as low-pass/high-pass filters with an output port, for example ports 212; 222 for the low-pass filtered signals and another port, for example ports 213; 223, for the high-pass filtered signals.

First and second diplexers 100, 210 and 220 generally have the same structure which is depicted in FIG. 2 and which can be seen in thin lines inside the respective diplexers on FIG. 3. They accommodate only one filter, the filter of the diplexer 100 being either a band-pass filter or a band-reject filter, the filter of the diplexers 210 and 220 being either low-pass filters or high-pass filters.

Characteristics of a frequency multiplexing-demultiplexing device according to the first embodiment of the invention as described in relation with FIG. 2 are given in the table I below.

TABLE I

| Diplexer | Cutoff frequencies | Filter type | Order |
|---|---|---|---|
| 100 | 3.35 GHz-3.85 GHz | Band-pass; Chebyshev | 8 |
| 210 | 3.6 GHz | Low-pass; Chebyshev | 20 |
| 220 | 3.6 GHZ | High-pass; Chebyshev | 20 |

The resulting bands are given in FIG. 5*a* along with the reference of the ports of the concerned diplexers over which the bands appear. Thin lines represent the responses of the involved filters. Note that for obtaining the cutoff frequencies of 3.1 GHz and 4.1 GHz, low-pass and high-pass filters can be needed (they are represented in dotted lines).

Another embodiment of a frequency multiplexing-demultiplexing device D according to the invention is now described in relation with FIG. 4, this embodiment enabling the use of filters that have lower orders than the orders of the filters of the previous embodiment.

The frequency multiplexing-demultiplexing device D has N output ports (in FIG. 4, N=4). Generally speaking, such a device D comprises a series of diplexers $\mathbf{10}_1$ to $\mathbf{10}_{N-1}$ (here $\mathbf{10}_1$ to $\mathbf{10}_3$) that are cascaded; i.e. an output port $\mathbf{13}_i$ of a diplexer 10*n* (n=1, 2, . . . , N−2) is connected to the input port 11*n*+1 of the following diplexer 10*n*+1 in the series of diplexers. More particularly in FIG. 3, the output port $\mathbf{13}_1$ of the diplexer $\mathbf{10}_1$ is connected to the input port $\mathbf{11}_2$ of the diplexer $\mathbf{10}_2$ and the output port $\mathbf{13}_2$ of the diplexer $\mathbf{10}_2$ is connected to the input port $\mathbf{11}_3$ of the diplexer $\mathbf{10}_3$. The input port $\mathbf{11}_1$ of the first diplexer $\mathbf{10}_1$ in the series of diplexers constitutes the input port DU of the frequency multiplexing-demultiplexing device D according to the invention. The output port $\mathbf{12}_i$ of each of the respective diplexers 10*n* (n=1 to N−1) constitutes the output ports DSi of the device D. The output port $\mathbf{13}_{N-1}$ of the last diplexer $\mathbf{10}_{N-1}$ in the series of diplexers constitutes the output port DSN of the device D (in FIG. 4, N =4).

Each diplexer 10*n* (n=1 to N−1) presents the structure that is depicted in FIG. 2. However, some precisions have to be brought when considering the present embodiment. Each diplexers 10*n* of a device D according to the invention act as band-pass/band-reject filters, i.e. it has an output port 12*n* for the band-pass filtered signals (the corresponding output port 12*n* is now said the band-pass output port) and the other output port 13*n* for the band rejected signals (the corresponding output port 13$n$ is now said the band-reject output port). For this purpose, the filter of each diplexers 10$n$ referred as to 16 in FIG. 2 is either a band-pass filter or a band-reject filter.

Note that if the filter 16 is a notch filter or a band-reject filter, the band-pass output port will be the port 13$n$ and the band-reject output port will be the port 12$n$ and, in FIG. 4, the two ports 12$n$ and 13$n$ have to be exchanged.

According to the invention, the band-pass output port 12$n$ for the band-pass filtered signals of a diplexer 10$n$ constitutes an output port DSn of the device D and the band-reject output port 13$n$ for the band-rejected signals of a diplexer 10$n$ is connected to the input port 11$n$+1 of the following diplexer 10$n$+1 in the series of diplexers, except for the last one $\mathbf{10}_N$ which constitutes the last output port DSN of the device D.

According to the invention, the band that a diplexer 10$n$ lets to pass over its band-pass output port 12$n$ for the band-pass filtered signals is included inside the band that the previous diplexer 10$n$−1 lets to pass over its band-reject output port 13$n$−1 for the band-rejected signals.

According to the invention, the bands over the output ports DS1, DS2, DS3 and DS4 do not overlap.

Since for a same order of the filter, a band-pass filter or a notch filter presents a more abrupt attenuation in function of the frequency than a high-pass or low-pass filter, for a same non-overlapping behaviour of the bands, a frequency multiplexing-demultiplexing device according to that embodiment of the invention requires filters having fewer order that the frequency multiplexing-demultiplexing devices of the previous embodiment such the one depicted on FIG. 2.

Another advantage of the invention compared with the previous embodiment resides in the fact that the bandwidths of all the required filters are identical and equal to the width between two consecutive bands whereas for the filters of the devices of the previous embodiment, the bandwidth of the filters of an input diplexer is generally twice of the bandwidths of its output filters, the bandwidth of the most output filters being equal to the width between two consecutive bands. Since the lower the bandwidth is the lower the order of a filter is and since the device of the present embodiment has no filter that presents a bandwidth larger than the one of another filter, this embodiment entails a lower complexity than the one of the afore-described devices.

Characteristics of a frequency multiplexing-demultiplexing device according to the second embodiment described in relation with FIG. 4 are given in the table II below.

TABLE II

| Diplexer | Cutoff frequencies | Filter type | Order |
|---|---|---|---|
| $10_1$ | 3.1 GHz-3.35 GHz | Band-pass; Chebyshev | 5 |
| $10_2$ | 3.4 GHz-3.6 GHz | Band-pass; Chebyshev | 5 |
| $10_3$ | 3.65 GHz-3.85 GHz | Band-pass; Chebyshev | 5 |

Instead of Chebyshev filters, elliptic filters can be used. Whereas for a frequency multiplexing-demultiplexing device according to the prior art, the orders of the filters are respectively 5 for the band-pass filters and 7 for the low-pass or high-pass filters, for a frequency multiplexing-demultiplexing device according to the invention, the order of all the filters falls down to 3.

The invention claimed is:

1. A frequency diplexer with an input port and a first and a second output ports, said frequency diplexer entailing on the first output port a first frequency response over a first frequency range and on the second output port another frequency response over a second frequency range complementary of the first frequency range, said frequency diplexer comprising:

two directional couplers, one being upstream, the other being downstream, each of which has one input port, a coupled output port, an isolated output port and a through output port, the input port of the upstream directional coupler acting as the input port of the diplexer, the isolated output port of the upstream directional coupler acting as the second output port of the diplexer, the through output port of the downstream directional coupler being supplied by a short-circuited adapting impedance and the coupled output port acting as the first output port of the diplexer, characterized in that it further comprises:

an unique filter that entails either the first or the second frequency response, and a first and a second T splitters each having an input port, an output port and a third port, the through output port and the coupled output port of the upstream directional coupler being respectively connected to the two ports of the first T splitter the third port of which is connected to the output port of the filter the input port of which is connected to a first port of the second T splitter, the two ports of the second T splitter being respectively connected to the input port and to the isolated output port of the downstream coupler.

2. The frequency multiplexing-demultiplexing device according to claim 1 having an input port and N output ports, said device comprises a series of N−1 diplexers, each diplexer acting as a band pass/band reject filter having a band-pass output port and a band reject output port, the band-pass output port of each diplexer being connected to an output port of said device and the band reject output port of each said diplexer being connected to the input port of the following diplexer in the series of diplexers except for the last diplexer of the series, an input port of the first diplexer of the series being connected to an input port of the device, and the band that a diplexer lets to pass over its band-pass output port being included inside the band that the previous diplexer allows to pass over its band-rejected output port.

3. The frequency multiplexing-demultiplexing device according to claim 1 having an input port and N output ports, said device comprising a first diplexer an input port which is connected to an input port of the device and two output ports which are respectively connected to input ports of two second diplexers, output ports of the two second diplexers are respectively connected to four output ports of the device, the first diplexer acting as a band-pass/band-reject filter and the two second diplexers acting as low-pass/high-pass filters.

* * * * *